(12) United States Patent
Santamaria

(10) Patent No.: US 6,308,477 B1
(45) Date of Patent: Oct. 30, 2001

(54) TELECOMMUNICATIONS CABINET ISOLATION, ALLOCATION AND MOUNTING SYSTEM

(75) Inventor: Oscar Santamaria, McKinney, TX (US)

(73) Assignee: Ericsson Inc., Richardson, TX (US)

( * ) Notice: Subject to any disclaimer, the term of this patent is extended or adjusted under 35 U.S.C. 154(b) by 0 days.

(21) Appl. No.: 09/603,223

(22) Filed: Jun. 26, 2000

(51) Int. Cl.[7] ..................................................... E04C 2/52
(52) U.S. Cl. ........................... 52/220.1; 52/263; 52/36.1; 312/223.6; 312/351.1; 211/26; 108/50.02
(58) Field of Search .......................... 211/26; 312/223.6, 312/351.1; 108/50.02; 52/220.1, 263, 36.1, 177; 428/147

(56) References Cited

U.S. PATENT DOCUMENTS

| | | | |
|---|---|---|---|
| Re. 33,220 | * 5/1990 | Collier | 52/263 |
| 3,924,370 | * 12/1975 | Cauceglia | 52/126 |
| 6,129,434 | * 12/1998 | Melane | 312/351.1 |

* cited by examiner

Primary Examiner—Carl D. Friedman
Assistant Examiner—Chi Nguyen
(74) Attorney, Agent, or Firm—Arthur I. Navarro

(57) ABSTRACT

An isolating plate (10) and insulated bolt assembly (51) for electrically insulating a cabinet (22) for holding telecommunications switching equipment. The isolating plate (10) functions as an installation template to assist an installer with locating and installing cabinets (22) in a telecommunications center. The precut cable ways (12) and mounting holes (14) allow the installer to quickly locate and cut the floor as needed for cables (15) and bolts (26) required to install the cabinet (22).

28 Claims, 4 Drawing Sheets

TELECOMMUNICATIONS CABINET ISOLATION, ALLOCATION AND MOUNTING SYSTEM

TECHNICAL FIELD

This invention relates in general to the installation of telecommunications equipment cabinets. More particularly, the invention relates to a means of electronically isolating an equipment cabinet from the floor and allocating floor space for an installation of cabinets.

BACKGROUND OF THE INVENTION

Without limiting the scope of the invention, its background is described in connection with installing and electronically isolating telecommunications switching equipment cabinets, as an example.

The backbone of a telecommunications network consists of switching centers and either wireless or wireline communication links coupling the switching centers. A switching center is a place where telephony and electronic communications are routed from one point to another point in the network service area. The switches and equipment in a switching center are customarily mounted in a cabinet for protection. Typically, cabinets are installed in rows with cabinets placed side-by-side to form what is known in the industry as a "suite". Suites of cabinets are also placed back-to-back with to create a "double suite".

Since switching centers have a limited amount of floor space, it is important to keep the installation of a cabinet or suite in a precise and compact area. It is a time consuming task for cabinet installers to measure and layout the exact locations for the cabinets. It is especially time consuming to identify the proper location for cabinet mounting bolts and cable ways. Cable ways are chutes which allow cables to pass from the cabinet into areas beneath the floor of the switching center. In some installations, switching centers have a "computer floor". A computer floor is a raised tile floor which allows cables to be routed between individual cabinets. The cables run from the bottom of a cabinet, underneath the computer floor and up in to another cabinet.

It is important for the protection of the equipment inside the cabinet that the cabinet be electronically isolated from the building. if the cabinet is not isolated, damage to the equipment inside the cabinet may result from, for example, electric overcharge or unexpected power supply disturbances. The damage results in unnecessary expense to replace the damaged equipment, loss of revenue from the equipment down time, and possible harm to people.

One means of achieving isolation involves the use of an electrically nonconductive material, such as plastic. Pieces of such a material have been placed beneath a cabinet in a manner intended to prevent the cabinet from making direct contact with the floor. These pieces are taken from whatever sources of electrically nonconductive material are available at the time of installation.

The disadvantages of this method are that the pieces do not always assure complete isolation of the cabinet, and are not suitable for reuse when cabinets are relocated in a telecommunications switching center or another location. Another disadvantage of many pieces of electrically nonconductive material is that extensive manual labor is required to measure and layout the cabinets in the proper locations.

The disadvantages of this method are that the pieces do not always assure complete isolation of the cabinet, and are not suitable for reuse when cabinets are relocated in a telecommunications switching center or another location. Another disadvantage of many pieces of electrically nonconductive material is that a extensive manual labor is required to measure and layout the cabinets in the proper locations.

Accordingly, a means of facilitating the installation of equipment cabinets in a telecommunications switching center that provides insulation between the cabinet and the floor upon which it is installed would provide numerous advantages.

SUMMARY OF THE INVENTION

The present invention provides a method and system for isolating the equipment inside a cabinet of the type typically used in a telecommunications switching center. With the present invention the cabinet is electrically isolated from the floor.

Disclosed in one embodiment is a method for installing a telecommunications equipment cabinet. The method includes the step of locating an isolating plate within a desired location of a switching room floor. Next, the cable ways and mounting holes are located in the floor and the cabinets are placed in position over the isolating plate permitting the cables to be routed into the cabinet.

In one embodiment, the method includes the step of using an isolator plate as a template for establishing the proper location for a cabinet and the location for openings such as cable ways and bolt holes in the floor. The installer lays the isolating plate in the proper location on the floor. The isolator plate can simply just lay down on the floor or alternatively, the installer attaches the isolating plate to the floor with screws, adhesive or other appropriate means. This allows an installer to quickly establish the location of a cabinet and to cut any holes that need to be made in the floor.

In another embodiment, an isolating plate is generally the same size as the base of a cabinet. The isolating plate is placed between the cabinet and a floor to isolate the cabinet. The isolating plate has a precut opening to allow cables to pass through from the computer floor and into the cabinet. The isolating plate is a nonconductive material such as Haysite H950, GPO-3 composite.

In another embodiment, the isolating plate is attached to the cabinet prior to the installation on the floor. The isolating plate may be installed on the cabinet at the installation site or at the manufacturing factory. The cabinet is then attached to the floor and the cables are routed as necessary.

Disclosed in one embodiment is a telecommunications cabinet mounting system that uses the isolating plate and a insulated bolt assembly to protect the equipment inside the cabinet.

A technical advantage of the present invention is a simplified method for installing or relocating cabinets in a switching center, since it allows the exact location of a cabinet to be quickly and accurately determined.

An additional technical advantage is the complete electrical isolation of the cabinet, since the entire cabinet is separated from the floor by the isolating plate and the insulated bolt assembly. Electrical isolation is important for the proper functioning of the equipment inside the cabinet and to prevent harm to the equipment, building or people.

BRIEF DESCRIPTION OF THE DRAWINGS

For a more complete understanding of the present invention, including its features and advantages, reference is

Corresponding numerals and symbols in the figures refer to corresponding parts in the detailed description unless otherwise indicated.

DETAILED DESCRIPTION OF PREFERRED EMBODIMENTS

While the making and using of various embodiments of the present invention are discussed in detail below, it should be appreciated that the present invention provides many applicable inventive concepts which can be embodied in a wide variety of specific contexts. These specific embodiments discussed herein are merely illustrative of specific ways to make and use the invention, and do not delimit the scope of the invention.

Figure 1:
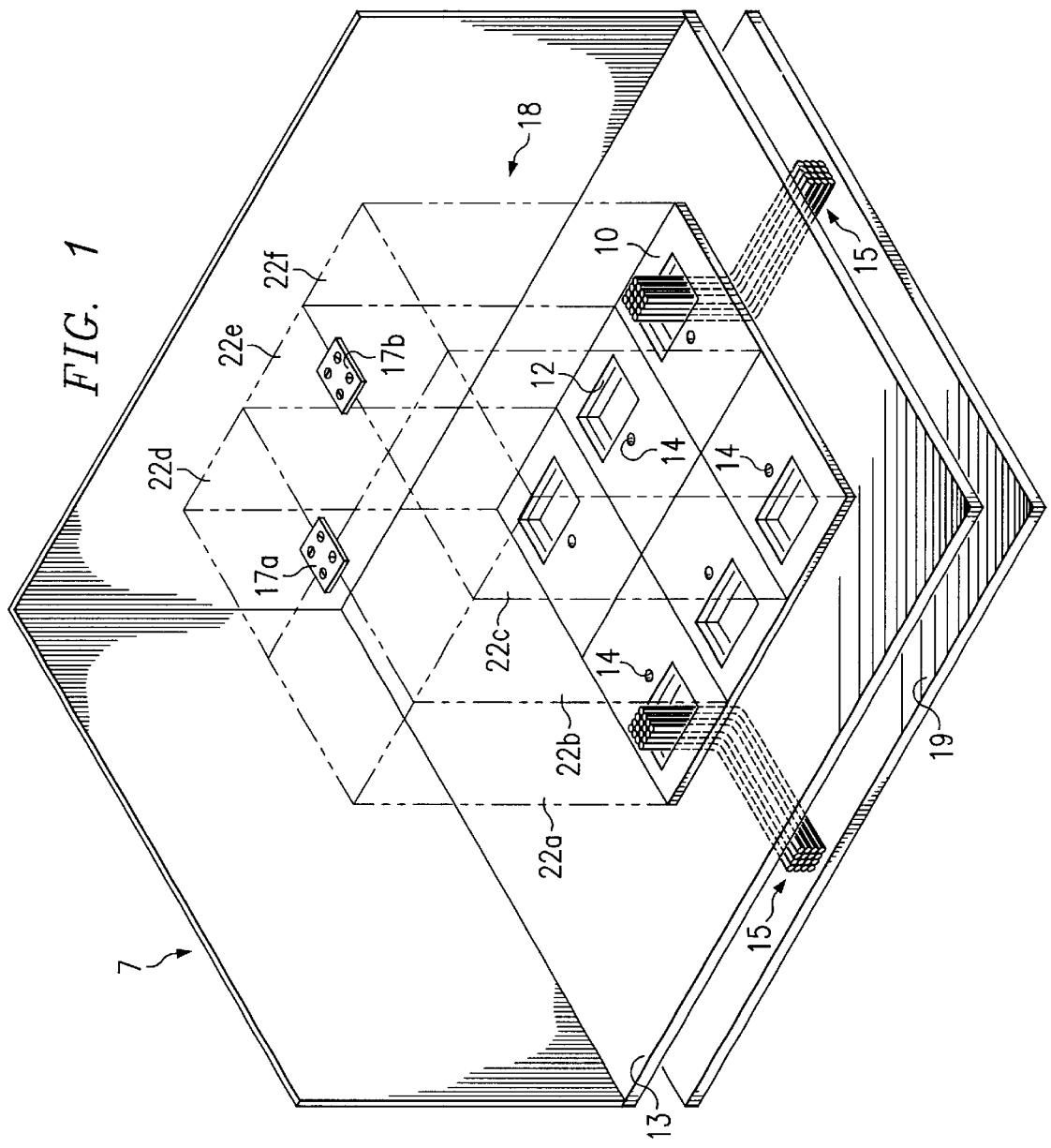
FIG. 1 depicts a typical installation in a telecommunications switching center.

With reference to FIG. 1, therein is shown a telecommunications switching center 7. The telecommunications switching center 7 contains a suite 18 consisting of cabinets 22a, 22b and 22c. The telecommunications switching center 7 has a computer floor 13 which is a raised tile floor. A computer floor 13 is installed a fixed distance above a building floor 19. An open space is formed between the computer floor 13 and a building floor 19 to allow cables 15 to be routed as required in the telecommunications switching center 7. An isolating plate 10 is placed in the desired location on top of the computer floor 13. The isolating plate 10 can simply lay down on the floor or alternatively, the isolator plate is held in place with screws, adhesive or other suitable means of attachment. A specific cabinet is placed on top of an isolating plate 10 and cables 15 are routed beneath the computer floor 13 up through a cable way 12 in the isolating plate 10 and into the cabinet 22. The cabinet 22 is secured to the building floor 19 by bolts passing through the base of the cabinet 22, through the mounting holes 14 in the isolating plate 10 and into a threaded floor anchor, nut, or other suitable means of attachment (not shown).

With reference to FIG. 1, therein is shown a telecommunications switching center 7. The telecommunications switching center 7 contains a suite 18 consisting of cabinets 22a, 22b and 22c. The telecommunications switching center 7 has a computer floor 13 which is a raised tile floor. A computer floor 13 is installed a fixed distance above a building floor 19. An open space is formed between the computer floor 13 and a building floor 19 to allow cables 15 to be routed as required in the telecommunications switching center 7. An isolating plate 10 is placed in the desired location on top of the computer floor 13. The isolation plate 10 can simply lay down on the floor or alternatively, the isolator plate is held in place with screws, adhesive or other suitable means of attachment. A specific cabinet is placed on top of an isolating plate 10 and cables 15 are routed beneath the computer floor 13 up through a cable way 12 in the isolating plate 10 and into the cabinet 22. The cabinet 22 is secured to the building floor 19 by bolts passing through the base of the cabinet 22, through the mounting holes 14 in the isolating plate 10 and into a threaded floor anchor, nut, or other suitable means of attachment (not shown).

The individual cabinets 22a, 22b, 22c, 22d, 22e, 22f are attached to each other by joining plates 17a, 17b to form a suite 18. A joining plate 17a is placed on top of cabinets 22a, 22b, 22d, 22e and held in place by bolts (not shown) which are inserted through the joining plate 17a and into the cabinets 22a, 22b, 22d, 22e. One joining plate 17a may be used to connect up to four individual cabinets. The bolts pass through holes in the top of cabinets 22a, 22b, 22d, 22e and are fastened in place with nuts (not shown). Joining plate 17a is placed across the intersection of four cabinets 22a, 22b, 22d, 22e, with one bolt (not shown) attaching the joining plate to each cabinet 22a, 22b, 22d, 22e. Joining plate 17b is placed across two cabinets 22e, 22f with two bolts (not shown) attaching the plate the joining plate to each cabinet 22e, 22f. For convenience, the terms "cabinet" and "cabinets", "suite" and "suites", "hole" and "holes", "bolt" and "bolts", "joining plate" and "joining plates", and cable way" and cable ways" will be referred to interchangeably throughout in connection with both the singular and plural forms of the terms.

Figure 2:
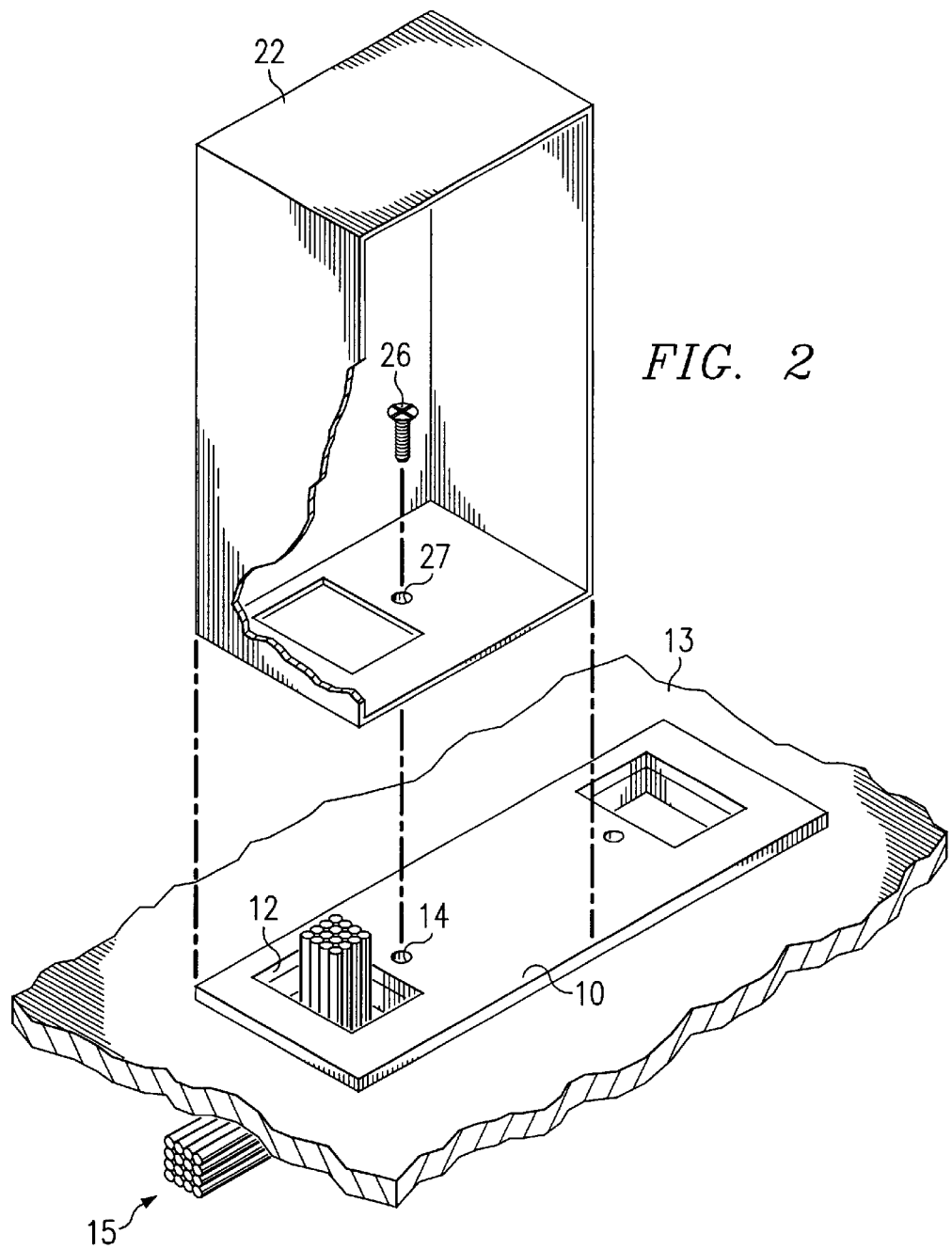
FIG. 2 illustrates a typical installation of a cabinet and isolating plate according to the invention.

In FIG. 2, assembly of a cabinet installation is illustrated. The isolating plate 10 is shown with a mounting hole 14 and a cable way 12. Cable 15 is shown being routed up and out of the floor, passing through the cable way 12 and into a cabinet 22. Cabinet 22 is secured to the floor by a bolt 26 passing through a bolt hole 27 in the cabinet 22. The bolt 26 then passes through the mounting hole 14 in the isolating plate 10 and secures into a means of attachment in the computer floor 13 such as a threaded floor anchor or a nut (not shown).

Since the isolating plate 10 is initially detached from the computer floor 13, it can be located, placed, and installed prior to placement of the cabinet 22 within the telecommunications switching center 7.

Given that numerous configurations for a telecommunications switching center 7 are possible, the ability to layout and place the isolating plate 10 in the switching center 7 prior to installation of the cabinet 22 provides numerous advantages. For example, depending on the length and width dimensions of a particular telecommunications switching center 7, more or less of the isolating plates 10 can be installed to accommodate a particular arrangement of cabinets 22 along the width or length of a telecommunications switching center 7. Since the cabinets 22 are relatively heavy and thus difficult to move or relocate once installed in the computer floor 13, the isolating plate 10 eases installation. In addition, due to its insulating characteristics, the isolating plate 10 decreases the risk of damage to the equipment held by a cabinet 22. For example, the isolating plate 10 can be made from a Haysite H950, GPO-3 composite or other similar material. These and other advantages will be apparent to those skilled in the art.

Figure 3:
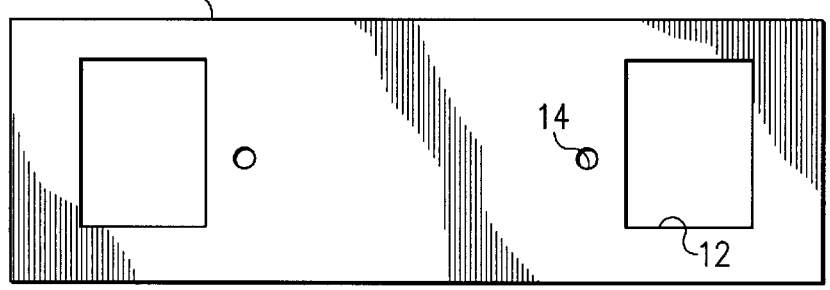
FIG. 3 depicts an isolating plate according to a preferred embodiment.

With reference to FIG. 3, therein is shown an isolating plate 10. The isolating plate 10 is seen to include a cable way 12 through which cables 15 are passed from the computer floor 13, through the isolating plate 10 and into a cabinet 22 of the type found in a typical telecommunications switching center 7. This isolating plate 10 also has mounting holes 14 for the bolts 26 securing a cabinet to the building floor 19 (not shown).

With reference to FIG. 3, therein is shown an isolating plate 10. The isolating plate 10 is seen to include a cable way 12 through which cables 15 are passed from the computer floor 13, through the isolating plate 10 and into a cabinet 22 of the type found in a typical telecommunications switching center 7. This switching plate 10 also has mounting holes 14 for the bolts 26 securing a cabinet to the building floor 19 (not shown).

Figure 4:
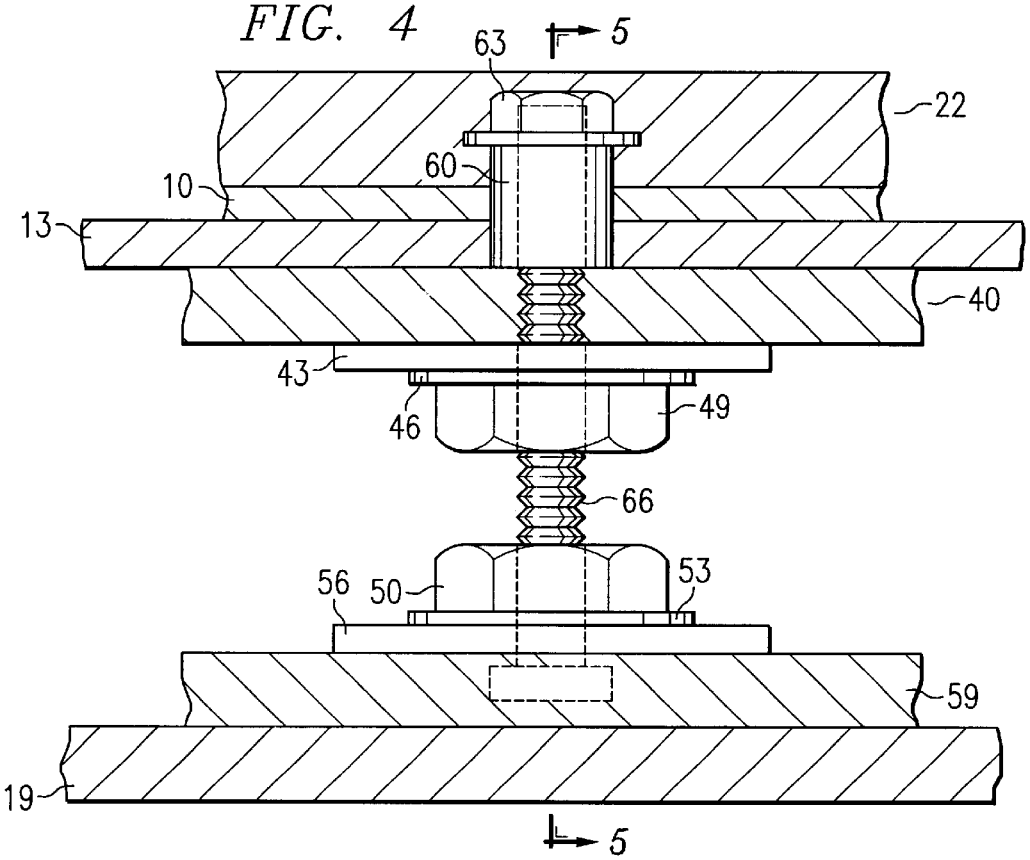
FIG. 4 depicts an insulated bolt assembly connecting a cabinet to a building floor according to a preferred embodiment.
Figure 5:
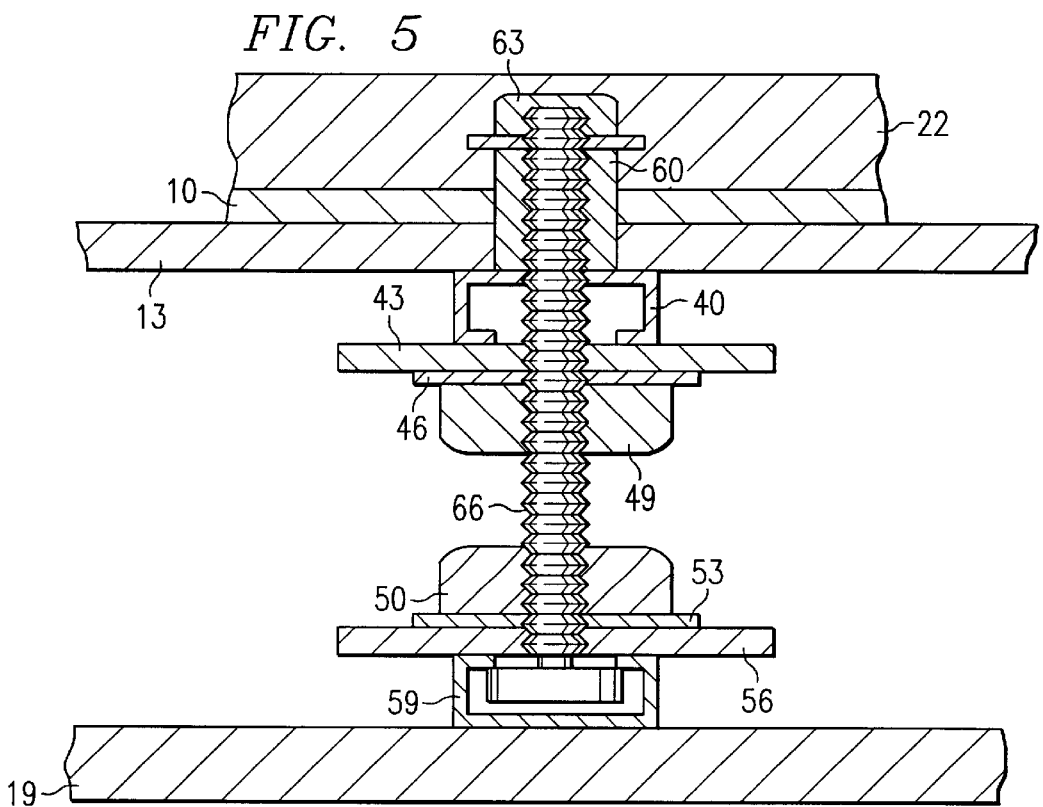
FIG. 5 illustrates cross-section of an insulated bolt assembly connecting a cabinet to a building floor according to a preferred embodiment.

In FIGS. 4 and 5, a telecommunications cabinet mounting system is shown. In a telecommunications switching center 7, having a building floor 19 and a computer floor 13, a C-shaped first channel 59 is attached to the building floor 19. Those knowledgeable in the art will use bolts (not shown) to attach the first channel 59 to the building floor 19. The first channel 59 has a base side, two side walls and an open side. The base side is adjacent to the building floor 19 and the open side is opposite the building floor 19.

The first channel 59 and a coupler assembly 56 provide a first anchor means of attachment for connecting the building floor 19 to a threaded rod 66. The first end of the threaded rod 66 terminates in the coupler assembly 56. A first washer 53 and a first nut 50 are placed on top of the coupler assembly 56. The first nut 50 is secured tightly against the coupler assembly 56 to lock the threaded rod 66 in place in the coupler assembly 56.

A second nut 49 and a second washer 46 are placed on the threaded rod 66 above the first nut 50. The second nut 49 and second washer 46 support a second anchor means to the threaded rod 66.

The second anchor means is shown as a channel anchor plate 43. The channel anchor plate 43 has a width larger than the width of the channel it supports. The channel anchor plate 43 also has a threaded hole to engage the threaded rod 66. The second nut 49 is secured tightly against the channel anchor plate 43 to lock the channel anchor plate 43 in position along the threaded rod 66.

A second C-shaped channel 40 is on top of the channel anchor plate 43. The second channel 40 has a base side, two side walls and an open side. The base side is opposite the channel anchor plate 43 and the open side is adjacent the channel anchor plate 43. A computer floor 13 is on top of the base side of the second channel 40. The threaded rod 66 passes through holes in the second channel 40 and the computer floor 13.

An isolating plate 10 is between the computer floor 13 and a cabinet 22. The isolating plate 10 has a hole to allow the treaded rod 66 pass into the base of the cabinet 22.

The base of the cabinet 22 has a socket to allow the second end of the threaded rod 66 to be recessed within the base of the cabinet 22. The preferred shape for the socket is cylindrical, although the shape is not limited to a cylinder. A hollow non-conducting insulator 60 is placed in a hole in the bottom of the socket. The insulator 60 is a cylinder with two open ends to allow the threaded rod 66 to pass through the insulator 60. One end of the insulator 60 has a disk larger in diameter than the hole in end the socket and smaller in diameter than the socket. The insulator 60 extends through the hole in the base of the cabinet 22 to the second channel 40. The insulator 60 separates the threaded rod 66 from the cabinet 22 and the computer floor 13.

A top securing means is used to hold the cabinet 22 to the threaded rod 66. The preferred top securing means is a top nut 63. The top nut 63 is a nut engaged with the threaded rod 66 and has a diameter less than the diameter of the disk on the insulator 60. The top nut 63 is on the second end of the threaded rod 66 and is tight against the disk of the insulator 60.

Figure 6:
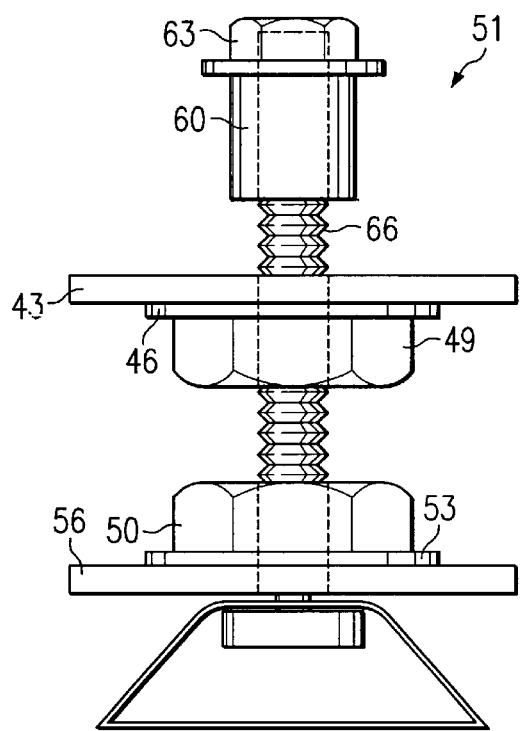
FIG. 6 depicts an insulated bolt assembly according to a preferred embodiment.

In FIG. 6, therein is shown an insulated bolt assembly 51 as described above with the cabinet 22, isolating plate 10, channels 40, 59 and floors 13, 19 omitted for clarity.

Figure 7:
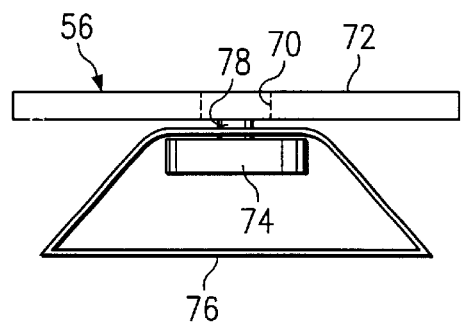
FIG. 7 depicts a side view of a coupler assembly according to a preferred embodiment.
Figure 8:
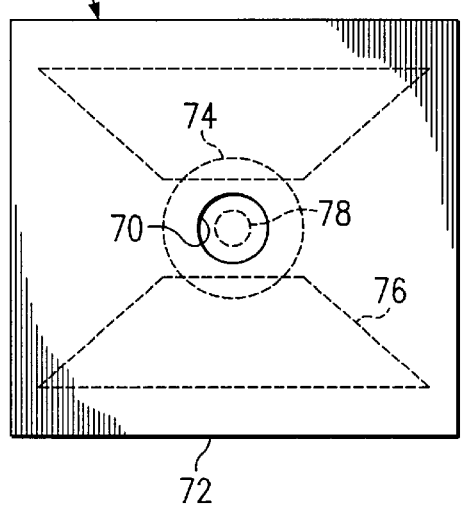
FIG. 8 depicts a top view of a coupler assembly according to a preferred embodiment.

The coupler assembly 56 is illustrated in FIGS. 7 and 8. The coupler assembly 56 has a plate 72 with a top side and a bottom side. The plate 72 is wider than the width of the first channel 59 so the plate 72 will sit on top of the first channel 59. The top side of the plate 76 has a threaded hole 70 which is connected to the fist end of the threaded rod 66. A neck 78 having a top end attached to the plate 72 extends down from the bottom side of the plate 72. The bottom end of the neck 78 is attached to a lobe 74 which holds the coupler assembly 56 in the first channel 59. The coupler assembly 56 has a spring support 76 to further hold it in place in the first channel 59.

The isolating plate 10 is reusable and may be moved with a cabinet 22. It is often desirable to move a cabinet 22 or suite 18 to different locations within a telecommunications switching center 7 or to an entirely different location. In either case, the ability to remove the isolating plate 10 from one location, layout the new location and electrically isolate the new installation is seen to have a great deal of improvement in installation flexibility and the time required to install a cabinet 22.

The insulated bolt assembly 51 provides a secure cabinet mount which protects the equipment inside a cabinet 22 from unwanted electrical circuits. In addition, the insulated bolt assembly 51 is adaptable to most installation configurations. It may be used with a computer floor 13 and a building floor 19 or in a single floor installation.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description.

What is claimed is:

1. A telecommunications cabinet mounting system comprising:
 a building floor;
 a first anchor means attached to said building floor;
 a threaded rod, having a first end terminated in said first anchor means and a second end;
 an insulator selectively surrounding said threaded rod;
 a cabinet positioned over said building floor, said cabinet having a base adapted to receive said threaded rod;
 a top securing means to hold said cabinet in place; and
 an isolating plate beneath said cabinet having a mounting hole to accommodate said threaded rod and said insulator, said isolating plate further including at least one cable way in order to accommodate one or more objects passing through said plate and into said cabinet.

2. The telecommunications cabinet mounting system of claim 1 further including:
 a computer floor beneath said isolating plate having a hole to accept said threaded rod and said insulator and
 a second anchor means below said computer floor, secured to the threaded bolt.

3. The telecommunications cabinet mounting system of claim 1 further including a generally C-shaped first channel attached to the building floor, said first channel having a base side, an open side and two side walls, said base side adjacent to the building floor, said first channel is adapted to secure said first anchor means.

4. The telecommunications cabinet mounting system of claim 3 wherein said first anchor means is a coupler assembly comprising:
   a plate on top of the first channel larger in width than the width of said first channel, having a threaded hole in a top side of said plate to engage the first end of the threaded rod and a bottom side;
   a neck having a top end extending from a bottom side of said plate into the open side of said first channel and a bottom end; and
   a lobe on the bottom end of said neck, securing said first anchor into said first channel.

5. The telecommunications cabinet mounting system of claim 4 further including a first nut on top of said coupler assembly to lock said first end of said threaded rod into said coupler assembly.

6. The telecommunications cabinet mounting system of claim 5 further including a first washer between said first nut and said coupler assembly.

7. The telecommunications cabinet mounting system of claim 2 further including a second generally C-shaped channel attached to the computer floor, having a base side, an open side and two side walls, the base side joining a bottom side of said computer floor, said second channel is held in place along a portion of the threaded rod by said second anchor means.

8. The telecommunications cabinet mounting system of claim 7 wherein said second anchor means is a channel anchor plate below said second channel having a width larger than the width of said second channel, said channel anchor plate having a hole to accept a portion of said threaded rod, the second channel rests on top of the channel anchor plate.

9. The telecommunications cabinet mounting system of claim 8 wherein said hole in said channel anchor plate is threaded to engage the threaded rod.

10. The telecommunications cabinet mounting system of claim 8 further including a second nut below said channel anchor plate having threads to engage said threaded rod.

11. The telecommunications cabinet mounting system of claim 10 further including a second washer between said second nut and said channel anchor plate.

12. The telecommunications cabinet mounting system of claim 1 wherein said base is further adapted to receive said threaded rod in a cylindrical socket open on a top end and partially open on a bottom end, said socket adapted to hold said insulator and to allow said threaded rod to secure the cabinet with said top securing means in the socket and said top securing means engaged with said threaded rod.

13. The telecommunications cabinet mounting system of claim 12 wherein said insulator is a hollow cylinder with open ends, said hollow cylinder having a disk on one end smaller in diameter than said socket and larger in diameter than the open end of said socket, said insulator extending through the partially open end of said socket and held in place by said disk, said threaded rod passes through the open ends of said insulator and said securing means is a top nut, said top nut is tight against the disk of said insulator, said top nut having a diameter less than the diameter of the disk of said insulator.

14. A telecommunications cleft mounting system comprising:

a building floor;
a first anchor means attached to said building floor;
a threaded rod, having a first end terminated in said first anchor means and a second end;
an insulator selectively surrounding said threaded rod;
a cabinet over said building floor, having a base adapted to receive said threaded rod;
an isolating plate beneath said cabinet having a hole to accommodate said threaded rod and said insulator;
a computer floor beneath said isolating plate having a hole to accept said threaded rod and said insulator;
a second anchor means below said computer floor, secured to the threaded bolt; and
a top securing means to hold said cabinet in place.

15. The telecommunications cabinet mounting system of claim 14 further including a generally C-shaped first channel attached to the building floor, said first channel having a base side, an open side and two side walls, said base side adjacent to the building floor, said first channel is adapted to secure said first anchor means.

16. The telecommunications cabinet mounting system of claim 15 wherein said first anchor means is a coupler assembly comprising:
   a plate on top of the first channel larger in width than the width of said first channel, having a threaded hole in a top side of said plae to engage the first end of tho threaded rod and a bottom side;
   a neck having a top end extending from a bottom side of said plate into the open side of said first channel and a bottom end; and
   a lobe on the bottom end of said neck, securing said first anchor into said first channel.

17. The telecommunications cabinet mounting system of claim 16 further including a first nut on top of said coupler assembly to lock said first end of said threaded rod into said coupler assembly.

18. The telecommunications cabinet mounting system of claim 17 further including a first washer between said first nut and said coupler assembly.

19. The telecommunications cabinet mounting system of claim 18 further including a second generally C-shaped channel attached to the computer floor, having a base side, an open side and two side walls, the base side joining a bottom side of said computer floor, said second channel is held in place along a portion of the threaded rod by said second anchor means.

20. The telecommunications cabinet mounting system of claim 19 wherein said second anchor means is a channel anchor plate below said second channel having a width larger than the width of said second channel, said channel anchor plate having a hole to accept a portion of said threaded rod, the second channel rests on top of the channel anchor plant.

21. The telecommunications cabinet mounting system of claim 14 wherein said base is further adapted to receive said threaded rod in a cylindrical socket open on a top end and partially open on a bottom end, said socket adapted to hold said insulator and to allow said threaded rod to secure the cabinet with said top securing means in the socket and said top securing means engaged with said threaded rod.

22. A telecommunications cabinet mounting system comprising:
   a building floor;
   a first anchor means attached to said building floor;
   a generally C-shaped first channel attached to the building floor, said first channel having a base side, an open side and two side walls, said base side adjacent to the building floor, said first channel is adapted to secure said first anchor means;

a threaded rod having a first end terminated in said first anchor means and a second end;

an insulator selectively surrounding said threaded rod;

a cabinet over said building floor, having a base adapted to receive said threaded rod;

an isolating plate beneath said cabinet having a hole to accommodate said threaded rod and said insulator;

a computer floor beneath said isolating plate having a hole to accept said threaded rod and said insulator;

a second anchor means below said computer floor, secured to the threaded bolt;

a second generally C-shaped channel attached to the computer floor, having a base side, an open side and two side walls, the base side joining a bottom side of said computer floor, said second channel is held in place along a portion of the threaded rod by said second anchor means; and a top securing means to hold said cabinet in place.

23. The telecommunications cabinet mounting system of claim 22 wherein said first anchor means is a coupler assembly comprising:

a plate on top of the first channel larger in width than the width of said first channel, having a threaded hole in a top side of said plate to engage the first end of the threaded rod and a bottom side;

a neck having a top end extending from a bottom side of said plate into the open side of said first channel and a bottom end; and a lobe on the bottom end of said neck, securing said first anchor into said first channel.

24. The telecommunications cabinet mounting system of claim 23 further including a first nut on top of said coupler assembly to lock said first end of said threaded rod into said coupler assembly.

25. The telecommunications cabinet mounting system of claim 24 further including a first washer between said first nut and said coupler assembly.

26. The telecommunications cabinet mounting system of claim 25 wherein said second anchor means is a channel anchor plate below said second channel having a width larger than the width of said second channel, said channel anchor plate having a hole to accept a portion of said threaded rod, the second channel rests on top of the channel anchor plate.

27. The telecommunications cabinet mounting system of claim 26 wherein said base is further adapted to receive said threaded rod in a cylindrical socket open on a top end and partially open on a bottom end, said socket adapted to hold said insulator and to allow said threaded rod to secure the cabinet with said top securing means in the socket and said top securing means engaged with said threaded rod.

28. The telecommunications cabinet mounting system of claim 27 wherein said insulator is a hollow cylinder with open ends, said hollow cylinder having a disk on one end smaller in diameter than said socket and larger in diameter than the open end of said socket, said insulator extending through the partially open end of said socket and held in place by said disk, said threaded rod passes through the open ends of said insulator and said securing means is a top nut, said top nut is tight against the disk of said insulator, said top nut having a diameter less than the diameter of the disk of said insulator.

* * * * *